United States Patent
Li et al.

(10) Patent No.: US 6,171,944 B1
(45) Date of Patent: Jan. 9, 2001

(54) METHOD FOR BRINGING UP LOWER LEVEL METAL NODES OF MULTI-LAYERED INTEGRATED CIRCUITS FOR SIGNAL ACQUISITION

(75) Inventors: Xia Li, Fremont, CA (US); Glen Gilfeather, Del Valle, TX (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/074,627

(22) Filed: May 7, 1998

(51) Int. Cl.$^7$ ............................................. H01L 21/4763
(52) U.S. Cl. ......................... 438/622; 438/624; 438/637; 438/675; 438/784
(58) Field of Search ............................. 438/624, 622, 438/637, 638–639, 640, 676, 675, 763, 783, 784

(56) References Cited

U.S. PATENT DOCUMENTS

| | | | |
|---|---|---|---|
| 5,182,231 | * 1/1993 | Hongo et al. | 438/622 |
| 5,700,526 | * 12/1997 | Ximen et al. | 427/527 |
| 5,710,052 | * 1/1998 | Alvis et al. | 438/10 |
| 5,798,297 | * 8/1998 | Winnerl et al. | 438/622 |
| 5,824,598 | * 10/1998 | Yamaguchi | 438/676 |

* cited by examiner

Primary Examiner—Mary Wilczewski
Assistant Examiner—Yung A. Lin
(74) Attorney, Agent, or Firm—Sawyer Law Group LLP

(57) ABSTRACT

A method for bringing up lower level metal nodes of multi-layered IC devices (200) includes a step of boring a passage (210) down through the obstructing or non-target metal layers (220) exposing these layers, through the Inter Layer Dielectric layers (230), stopping at the target metal layer (240), and a step of depositing Gallium implanted insulator (250, 260) forming a node structure (280) with a conductive core (250) and an insulative sheath (260). The conductive core (250) brings up the target metal node or layer (240) and the insulative sheath (260) isolates the exposed non-target metal nodes or layers (220) from the target metal node (240) and the conductive core (250).

9 Claims, 1 Drawing Sheet

METHOD FOR BRINGING UP LOWER LEVEL METAL NODES OF MULTI-LAYERED INTEGRATED CIRCUITS FOR SIGNAL ACQUISITION

BACKGROUND OF THE INVENTION

The present invention relates to methods and tools used in modification, debugging and failure analysis of integrated circuit (IC) products or devices in the semiconductor industry, and more particularly to a method for bringing up lower level metal nodes of multi-layered IC devices in a manner that requires fewer steps than the prior art and is substantially more reliable than the prior art, and to an article produced by this method.

Bringing up lower level metal nodes of multi-layered IC devices is necessary for IC device modification or re-routing, and is very useful in debugging and failure analysis. This task, however, is difficult and tedious, especially when desired or target metal nodes or layers are buried under other higher level or non-target metal nodes or layers. As a result, not only are target nodes difficult to access, but also undesired shorts are difficult to prevent. The user avoids shorts between the target and non-target nodes by insulating the non-target nodes from the target node with an insulator material before bringing up the target node. To further complicate matters, as the number of metal layers increases, the lower level metal nodes become increasingly thinner and the node population becomes increasingly more dense. As can be expected, this increases the difficulty and decreases the success rate. Overall, the prior art method is problematic because it is unduly time-consuming and has a low success rate.

The conventional and most well known method for bringing up lower level target nodes is a four-step process using a focused ion beam (FIB) system. In summary, the first step is to expose the target metal node by milling. In most cases, this exposing step also exposes other nearby non-target metal nodes due to circuit density. The second step is to deposit insulative material to isolate the exposed non-target nodes, preventing them from shorting one another or the target node during the fourth step, the metal deposition step. FIB induced insulator deposition (the second step) provides two kinds of materials—a directly deposited or primary material within an ion-beam scan pattern and an indirectly deposited or secondary material due to the fringe energy of the ion beam. The third step is to mill away the directly deposited material of step two. The fourth step is to deposit metal, typically platinum or tungsten, to bring up the target metal node.

The prior art method steps and problems will now be described in more detail.

In the first step (FIG. 1), following the usual, customary and widely practiced analytical process, the user mills down through the obstructing or non-target metal layers 120 and the insulative inter layer dielectrics (ILD) 130, exposing these layers 120 and 130, and stops part way through the last ILD layer 130' in the customary manner just above the target metal layer 140. (For clarity of illustration, multiple layers typically above 130' and 140 have been omitted from the drawing figures.)

In the second step (FIG. 2), an ion beam deposits insulator material 160 to isolate the exposed non-target nodes 120 preventing them from shorting one another or the target node 140 during the forth step (FIG. 4), the metal deposition step. As stated, FIB induced insulator deposition provides two kinds of materials—a directly deposited or primary material 150 within an ion-beam scan pattern and an indirectly deposited or secondary material 160 due to the fringe energy of the ion beam. Tetraethyl Orthosilicate (TEOS) is the insulator material typically used and Gallium (Ga) is the ion source typically used to decompose TEOS gas to form and deposit the TEOS insulator material. Material analysis shows that the Ga content, due to Ga ion implantation, in the directly deposited material 150 is twice the amount of Ga content in the indirectly deposited material 160. As a result, the directly deposited material 150 is generally conductive while the indirectly deposited material 160 is insulative. Because an insulator is desired, the user, in known fashion, reduces the degree of Ga ion implantation in the insulator material by setting the Ga ion-beam to a low beam current level. This maximizes any insulative properties and minimizes any conductive properties. The ion-beam scan pattern is scanned such that the indirectly deposited or secondary material 160 insulates the non-target metal nodes 120 from the deposited metallic material 180 of Step 4 (FIG. 4).

As stated, because the primary intent of Step 2 is to insulate the non-target nodes 120, the directly deposited or primary material 150 is regarded as an undesired byproduct of the deposition and is milled away in Step 3 (FIG. 3.).

Thus, in the third step (FIG. 3.), the user mills through the primary material 150 eliminating it entirely, and continues milling through the remainder of the ILD layer 130' that was partially preserved in Step 1 (FIG. 1), stopping at the target metal node or layer 140. As is well known, the user observes the procedure via a secondary electron image. Insulative material produces a dark image; conductive material produces a light image. The user knows when to stop because the primary material 150 being conductive produces a light image, the ILD material 130' being insulative produces a dark image, and the target metal layer 140 being conductive produces a light image. In other words, the secondary electron image goes from light (primary material) to dark (ILD) to light (target metal layer). This is the most difficult step due to poor contrast between underlying metal and deposited insulator material. This step may require practice on a practice chip which can make the overall procedure tedious and unduly time consuming.

The fourth step is to deposit metal 180, typically platinum or tungsten, to bring up the target metal node 140.

Excessive time consumption, difficulty, and a disappointingly low success rate are the main disadvantages of the prior art. The prior art has attempted to address these concerns but has fallen short of producing desired and reliable results.

A need therefore remains for a method for bringing up lower level target nodes in a manner that is time efficient, simple, and reliable, and for a reliable node structure resulting from the method. Such a node structure needs to have an easily and reliably generated conductive portion which is insulated from surrounding non-target metal layers. Also, the method must sustain device functionality.

SUMMARY OF THE INVENTION

The present invention meets the above needs and objectives with a new and improved method for bringing up a lower level metal node, and a resulting node structure that reliably brings up the lower level target metal node. This node structure has a sufficiently conductive core connected to the target metal node and a sufficiently insulative sheath preventing surrounding non-target metal nodes from shorting one another, the conductive core, or the target metal node.

In the preferred embodiment, the method according to the present invention requires only two steps: first, exposing the target metal node by milling down to it; and second, depositing Ga implanted TEOS material directly onto the target node to create a node structure having a substantially conductive core and a substantially insulative sheath. The resulting node structure extends from the target node upwardly such that the conductive core makes electrical contact with the target node. The insulative sheath prevents surrounding non-target metal nodes from shorting one another, the conductive core, or the target metal node.

The present invention provides a more expedient and more reliable two-step method over the four-step method of the prior art. In the first step of the present invention, the user mills down to the target metal node or layer unconcerned about surrounding non-target metal nodes. After depositing Ga implanted TEOS material onto the target node in the manner taught herein, the user simply probes the target node via the resulting node structure, requiring half as many steps as the prior art. The present invention also sustains device functionality substantially more reliably than the prior art.

The equipment and material used for this method, of course, will depend upon the latest equipment and material technology available and their anticipated variations as transistor geometries and density continue to evolve.

The end result is a desired method for bringing up lower level target metal nodes for modification, debugging and failure analysis of integrated circuit products or devices. This result is produced in a manner that requires fewer steps than the prior art and is substantially more reliable than the prior art. Not only is the present invention significantly more convenient for the user, but it also expedites the diagnostic processes and provides for substantially improved reliability in such sequential operations.

It is therefore a benefit of the present invention to provide a new and improved method for bringing up lower level metal nodes of multi-layered integrated circuits for signal acquisition, wherein the method includes, exposing a target node beneath at least one conductive layer, and in a continuous operation, depositing on the target node a substantially conductive core and a substantially insulative sheath which extend from the target node upwardly such that the conductive core makes electrical contact with the target node and is insulated from other such conductive layers; in which the method may further include probing the conductive core; in which the exposing step may include milling the integrated circuit; in which the depositing step may include depositing an insulator material heavily implanted with metallic ions; in which the depositing step may include depositing an insulator material heavily implanted with Ga ions; in which the depositing step maybe a single deposition step; in which the milling step may include focused ion beam milling; in which the depositing step may include focused ion beam deposition; and to provide a resulting node structure having a substantially conductive core and a substantially insulative sheath protecting the conductive core, the conductive core and insulative sheath being formed from substantially the same material, the insulative sheath being a different material from the structural material of the integrated circuit, and the conductive core and insulative sheath extending from a target node upwardly through at least one conductive layer, the conductive core making electrical contact with the target node, and the sheath insulating the conductive core from other such conductive layers; in which the conductive core and insulative sheath material may include an insulator material heavily implanted with metallic ions; in which the conductive core and insulative sheath material may include an insulator material heavily implanted with Ga ions; in which the insulative sheath may expose only the portions of the conductive core in electrical contact with the target node and at the opposite end thereof; and to accomplish the above objectives and purposes in an inexpensive, uncomplicated, versatile, and reliable method and article, inexpensive to manufacture, and readily suited to the widest possible utilization.

These and other benefits and advantages of the invention will be apparent from the following description, the accompanying drawings, and the appended claims.

BRIEF DESCRIPTION OF THE DRAWINGS

Certain method steps and embodiments of the present invention are described, reference being made to the accompanying drawings, wherein.

DESCRIPTION OF THE PREFERRED EMBODIMENT

With reference to the drawings and according to the present invention, the new and improved method for bringing up lower level metal nodes of multi-layered IC devices and an article produced by this method will now be described.

Figure 5:
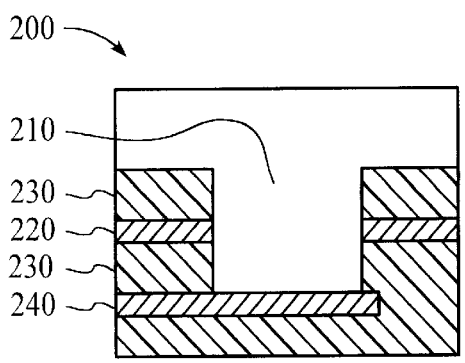
FIG. 5 is a cross-sectional view of a circuit after Step 1 of the present invention.

FIG. 5 shows a cross-sectional view of a multi-layer integrated circuit 200 after Step 1 of the present invention. In Step 1, the user simply bores a passage 210 down through the obstructing or non-target metal layers 220 exposing these layers 220, through the Inter Layer Dielectric (ILD) layers 230, stopping at the target metal layer 240.

Figure 1:
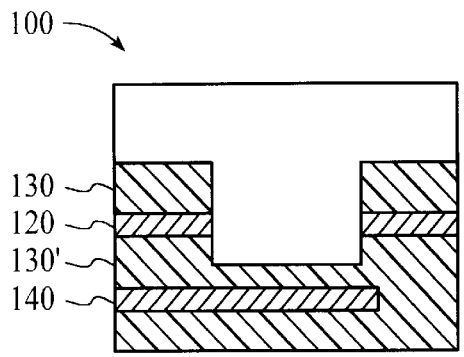
FIG. 1 is a cross-sectional view of a multi-layer integrated circuit after Step 1 of the prior art.
Figure 2:
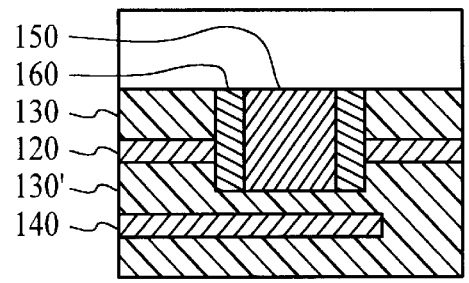
FIG. 2 is a cross-sectional view of the FIG. 1 circuit after Step 2 of the prior art.
Figure 3:
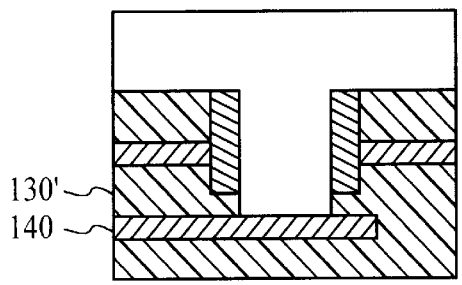
FIG. 3 is a cross-sectional view of the circuit after Step 3 of the prior art.
Figure 4:
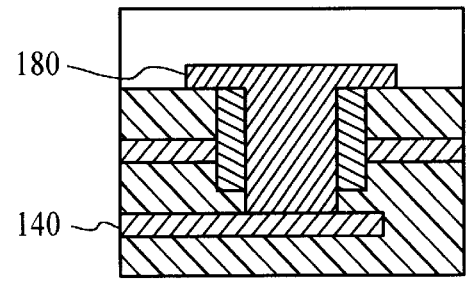
FIG. 4 is a cross-sectional view of the circuit after Step 4 of the prior art.
Figure 6:
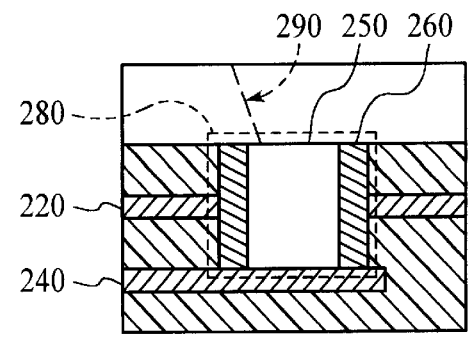
FIG. 6 is a cross-sectional view of the FIG. 5 circuit after Step 2 of the present invention, showing the target metal layer, resulting conductive core, and resulting insulative sheath.

FIG. 6 shows a cross-sectional view of the circuit 200 after Step 2 of the present invention. In Step 2, the user deposits TEOS material implanted with Ga 250, 260 forming a conductive core 250 and an insulative sheath 260. The conductive core 250 brings up the target node 240; the insulative sheath 260 isolates the exposed non-target nodes 220 from one another, the conductive core 250 and the target node 240. As described above, FIB induced deposition provides two kinds of materials—a directly deposited or primary material 250 within an ion-beam scan pattern and an indirectly deposited or secondary material 260 due to the fringe energy of the ion beam. The user optimizes the Ga ion-beam used to deposit the TEOS material 250, 260 to a substantially high beam current level (at least 350 pA) to implant sufficient Ga ions in the TEOS primary material 250 (conductive core) resulting in conductive properties comparable to that of platinum. This provides for a sufficient conductive contact between an e-beam probe and a target metal node 240. (The beam current taught by the prior art TEOS deposition step is low, typically 150 pA, which results in a resistivity of the core 150 (FIG. 2) of a magnitude 1000 times greater than that of platinum.) The beam current of the present invention (around 350 pA) still provides the secondary material 260 (insulative sheath) with sufficient insulative properties to isolate surrounding previously exposed non-target metal nodes 220 from one another, the primary material (conductive core) 250 and the target metal node 240. Mechanical probing confirms that the sheath is sufficiently insulative.

Material analysis has shown that the core 250 (FIG. 6) conductivity of TEOS material which has been directly deposited in this manner, that is with high current Ga ion-beam, is high enough to be utilized as a metallic material sufficiently conductive to bring up lower metal nodes for e-beam signal acquisition.

FIG. 6 also shows the resulting node structure 280 produced by Step 1 and Step 2. The node structure 280 has a conductive core 250 having electrical contact with the target metal layer 240 and an insulative sheath 260 preventing the surrounding non-target metal layers 220 from shorting one another, the conductive core 250, or the target metal layer 240.

Finally, to use the present invention to test circuit 200, the user probes 290 the target metal node via the conductive core 250 portion of the resulting node structure 280. While e-beam and mechanical probes are available, e-beam probes are preferred.

As may be seen, therefore, the present invention provides numerous advantages. Principally, it eliminates problems such as excessive time consumption and unreliability, problems that the prior art has failed to resolve satisfactorily. The present invention satisfies the user's needs in only two steps, rather than four. Also, the steps of the present invention are simpler than those of the prior art, making the overall procedure more time efficient and reliable.

Other variations on the present invention will occur after reading and understanding the present disclosure. Therefore, while the methods and forms of apparatus herein described constitute preferred embodiments of this invention, it is to be understood that the invention is not limited to these precise methods and forms of apparatus, and that changes may be made therein without departing from the scope of the invention. One such change for example might be the use of other equipment and material in carrying out the method, depending upon the latest equipment and material technology and their anticipated variations as transistor geometries and density continue to evolve.

What is claimed is:

1. A method for bringing up lower level metal nodes of multi-layered intergrated circuits for signal acquisition, comprising:

a) exposing a target node beneath at least one conductive layer; and b) in a continuous single step operation, depositing on the target node a substantially conductive core and a substantially insulative sheath which extend from the target node upwardly such that the conductive core makes electrical contact with the target node and is insulated from other such conductive layers.

2. A method as in claim 1, further comprising the step of probing the conductive core.

3. A method as in claim 1 wherein said exposing step further comprises milling the integrated circuit.

4. A method as in claim 3 wherein said milling step further comprises focused ion beam milling.

5. A method as in claim 1 wherein said depositing step further comprises depositing an insulator material wherein an amount of metallic ions are implanted in the insulator material, wherein the amount of metallic ions that are implanted in the insulator material results in the formation of conductive properties comparable to that of platinum.

6. A method as in claim 5 wherein said metallic ions are Gallium ions.

7. A method as in claim 1 wherein said depositing step is a single deposition step.

8. A method as in claim 1 wherein said depositing step further comprises focused ion beam deposition.

9. A method for bringing up lower level metal nodes of multi-layered integrated circuits for signal acquisition, comprising:

a) milling an integrated circuit with a focused ion beam down to a target node beneath at least one conductive layer;

b) in a continuous single step operation, depositing on the target node with a focused ion beam a substantially conductive Gallium implanted core and a substantially insulative Gallium implanted sheath which extend from the target node upwardly such that the conductive core makes electrical contact with the target node and is insulated from other such conductive layers; and c) probing the conductive core.

* * * * *